United States Patent
Juengling (10) Patent No.: US 7,125,800 B2
(45) Date of Patent: Oct. 24, 2006

(54) METHODS FOR MAKING NEARLY PLANAR DIELECTRIC FILMS IN INTEGRATED CIRCUITS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/677,057

(22) Filed: Sep. 30, 2003

(65) Prior Publication Data

US 2004/0061196 A1   Apr. 1, 2004

Related U.S. Application Data

(62) Division of application No. 09/801,265, filed on Mar. 7, 2001, now Pat. No. 6,627,549.

(60) Provisional application No. 60/187,658, filed on Mar. 7, 2000.

(51) Int. Cl.
*H01L 21/302* (2006.01)

(52) U.S. Cl. ............ 438/689; 438/584; 438/595; 438/645; 438/646; 438/656; 438/758

(58) Field of Classification Search ........... 438/584, 438/595, 645, 646, 656, 758
See application file for complete search history.

(56) References Cited

U.S. PATENT DOCUMENTS 5,252,520 A * 10/1993 Kocmanek et al. ......... 438/702
5,304,505 A * 4/1994 Hazani ...................... 438/264
5,461,003 A   10/1995 Havemann et al.
5,503,882 A    4/1996 Dawson
5,518,959 A    5/1996 Jang et al. ................. 437/190
5,776,834 A    7/1998 Avanzino et al. .......... 438/692
5,814,555 A    9/1998 Bandyopadhyay et al. . 438/619

(Continued)

FOREIGN PATENT DOCUMENTS

EP   0766291   4/1997

OTHER PUBLICATIONS

"Chemical Vapor Deposition", *Trikon Technologies*, http://www.trikon.com/trikon/html/cvd.html, (1999),pp. 1-5.

(Continued)

*Primary Examiner*—Luan Thai
(74) *Attorney, Agent, or Firm*—Schwegman, Lundberg, Woessner & Kluth, P.A.

(57) ABSTRACT

In the fabrication of integrated circuits, one specific technique for making surfaces flat is chemical-mechanical planarization. However, this technique is quite time consuming and expensive, particularly as applied to the numerous intermetal dielectric layers—the insulative layers sandwiched between layers of metal wiring—in integrated circuits. Accordingly, the inventor devised several methods for making nearly planar intermetal dielectric layers without the use of chemical-mechanical planarization and methods of modifying metal layout patterns to facilitate formation of dielectric layers with more uniform thickness. These methods of modifying metal layouts and making dielectric layers can be used in sequence to yield nearly planar intermetal dielectric layers with more uniform thickness.

14 Claims, 7 Drawing Sheets

U.S. PATENT DOCUMENTS

| | | |
|---|---|---|
| 5,858,876 A | 1/1999 | Chew .......................... 438/695 |
| 5,872,058 A | 2/1999 | Van Cleemput et al. .... 438/692 |
| 5,968,610 A * | 10/1999 | Liu et al. ..................... 438/435 |
| 6,030,881 A | 2/2000 | Papsouliotis et al. ........ 438/424 |
| 6,087,724 A * | 7/2000 | Shields et al. ............... 257/734 |
| 6,100,205 A | 8/2000 | Liu et al. |
| 6,136,687 A | 10/2000 | Lee et al. |
| 6,174,808 B1 | 1/2001 | Jang et al. |
| 6,207,571 B1 | 3/2001 | Juengling et al. ........... 438/692 |
| 6,223,331 B1 | 4/2001 | Juengling .................... 716/10 |
| 6,251,470 B1 | 6/2001 | Forbes et al. |
| 6,255,162 B1 * | 7/2001 | Tsai et al. .................... 438/257 |
| 6,274,479 B1 * | 8/2001 | Srinivasan ................... 438/632 |
| 6,531,412 B1 * | 3/2003 | Conti et al. .................. 438/778 |
| 6,599,847 B1 | 7/2003 | Jang et al. |

OTHER PUBLICATIONS

Stine, B. E., et al., "The Physical and Electrical Effects of Metal-Fill Patterning Practices for Oxide Chemical-Mechanical Polishing Processes", *IEEE Transactions on Electron Devices*, 45(3), (1998),pp. 665-679.

Wolf, S. , *Silicon Processing for the VLSI Era*, vol. 2: *Process Integration*, Lattice Press, Sunset Beach, California, ISBN 0-961672-4-5,(1990),pp. 176-297.

\* cited by examiner

METHODS FOR MAKING NEARLY PLANAR DIELECTRIC FILMS IN INTEGRATED CIRCUITS

RELATED APPLICATIONS

This application is a Divisional of U.S. application Ser. No. 09/801,265, filed Mar. 7, 2001, now U.S. Pat. No. 6,627,549, which claims priority to U.S. Provisional Application 60/187,658, filed on Mar. 7, 2000, both of which are incorporated herein by reference.

TECHNICAL FIELD

The present invention concerns methods of making integrated circuits, particularly methods of making metal masks and dielectric, or insulative, films.

BACKGROUND OF THE INVENTION

Integrated circuits, the key components in thousands of electronic and computer products, are interconnected networks of electrical components fabricated on a common foundation, or substrate. Fabricators typically build the circuits layer by layer, using techniques, such as doping, masking, and etching, to form thousands and even millions of microscopic resistors, transistors, and other electrical components on a silicon substrate, known as a wafer. The components are then wired, or interconnected, together to define a specific electric circuit, such as a computer memory.

One important concern during fabrication is flatness, or planarity, of various layers of the integrated circuit. For example, planarity significantly affects the accuracy of a photo-imaging process, known as photomasking or photolithography, which entails focusing light on light-sensitive materials to define specific patterns or structures in a layer of an integrated circuit. In this process, the presence of hills and valleys in a layer forces various regions of the layer out of focus, causing photoimaged features to be smaller or larger than intended. Moreover, hills and valleys can reflect light undesirably onto other regions of a layer and add undesirable features, such as notches, to desired features. These problems can be largely avoided if the layer is sufficiently planar.

One process for making surfaces flat or planar is known as chemical-mechanical planarization or polishing. Chemical-mechanical planarization typically entails applying a fluid containing abrasive particles to a surface of an integrated circuit, and polishing the surface with a rotating polishing head. The process is used frequently to planarize the insulative, or dielectric, layers that lie between layers of metal wiring in integrated circuits. These insulative layers, which typically consist of silicon dioxide, are sometimes called intermetal dielectric layers. In conventional integrated-circuit fabrication, planarization of these layers is necessary because each insulative layer tends to follow the hills and valleys of the underlying metal wiring, similar to the way a bed sheet follows the contours of whatever it covers. Thus, fabricators generally deposit an insulative layer much thicker than necessary to cover the metal wiring and then planarize the insulative layer to remove the hills and valleys.

Unfortunately, conventional methods of forming these intermetal dielectric layers suffer from at least two problems. First, the process of chemical-mechanical planarization is not only relatively costly but also quite time consuming. And second, the thickness of these layers generally varies considerably from point to point because of underlying wiring. Occasionally, the thickness variation leaves metal wiring under a layer too close to metal wiring on the layer, encouraging shorting or crosstalking. Crosstalk, a phenomenon that also occurs in telephone systems, occurs when signals from one wire are undesirable transferred or communicated to another nearby wire.

Accordingly, the art needs fabrication methods that reduce the need to planarize intermetal dielectric layers, that reduce thickness variation in these layers, and that improve their electrical properties generally.

SUMMARY OF THE INVENTION

To address these and other needs, the inventor devised various methods of making dielectric layers on metal layers, which reduce the need for chemical-mechanical planarization procedure. Specifically, a first exemplary method of the invention forms a metal layer with a predetermined maximum feature spacing and then uses a TEOS-based (tetraethyl-orthosilicate-based) oxide deposition procedure to form an oxide film having nearly planar or quasi-planar characteristics. The exemplary method executes a CVD (chemical vapor deposition) TEOS oxide procedure to form an oxide layer on a metal layer having a maximum feature spacing of 0.2–0.5 microns.

A second exemplary method includes voids within the oxide, or more generally insulative, film to improve its effective dielectric constant and thus improve its ability to prevent shorting and crosstalk between metal wiring. Specifically, the exemplary method uses a TEOS process at a non-conformal rate sufficient to encourage the formation of voids, and then uses the TEOS process at a conformal rate of deposition to seal the voids. More generally, however, the invention uses a non-conformal deposition procedure to encourage formation of voids and then a more conformal deposition to seal the voids.

A third exemplary method increases the metal-fill density of metal patterns to facilitate formation of intermetal dielectric layers having more uniform thicknesses. The third exemplary method adds floating metal to open areas in a metal layout and then extends non-floating metal dimensions according to an iterative procedure that entails filling in notches, and corners and moving selected edges of the layout.

DESCRIPTION OF THE PREFERRED EMBODIMENTS

The following detailed description, which references and incorporates the above-identified Figures, describes and illustrates specific embodiments of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

First Exemplary Method of Forming Nearly Planar Dielectric Films

FIGS. 1–4 show a number of exemplary integrated-circuit assemblies, which taken collectively and sequentially, illustrate an exemplary method of making nearly planar or quasi planar dielectric films, or layers, within the scope of the present invention. As used herein, a quasi planar film is globally planar with local nonplanarities having slopes less than or equal to 45 degrees and depths less than the thickness of the next metal layer to be deposited. The local nonplanarities typically occur over the gaps between underlying metal features.

Figure 1:
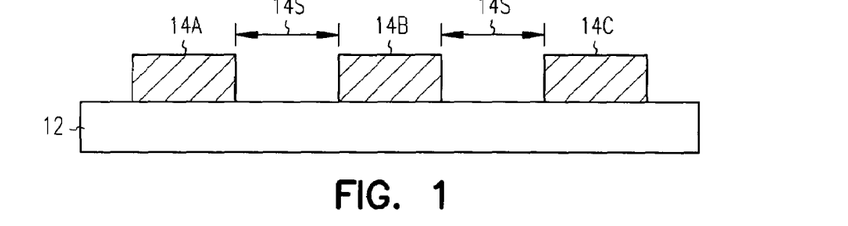
FIG. 1 is a cross-sectional view of a partial integrated-circuit assembly 10 including a substrate 12 and metal wires 14a, 14b, and 14c.

The method, as shown in FIG. 1, a cross-sectional view, begins with formation of an integrated-circuit assembly or structure 10, which can exist within any integrated circuit, for example, an integrated memory circuit. Assembly 10 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 includes three representative wires or conductive structures 14a, 14b, and 14c, with a maximum (or average) feature spacing 14s. In the exemplary embodiment, wires 14a–14c are approximately 3000–6000 angstroms thick and comprise metals, such as aluminum, gold, or silver, and nonmetals, such as heavily doped polysilicon. Spacing 14s, in the exemplary embodiment, is 0.3 microns.

Wires 14a–14c can be formed using any number of methods, for example, photolithography and dry etching. To avoid increasing feature spacing during dry etching, the exemplary embodiment forms a lateral-etch-resistant layer, that is, a layer resistant to lateral etching, on a metal layer before etching. Examples of suitable layers include a TEOS, oxide-nitride layer. Alternatively, one can add extensive serif features to the metal mask layout to avoid large open areas, especially to reduce the diagonal distance between features.

Figure 2:
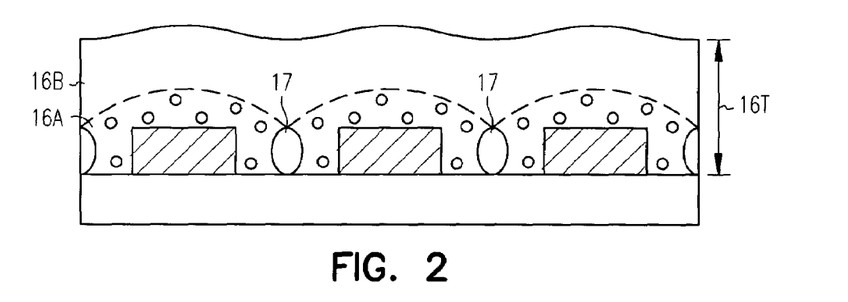
FIG. 2 is a cross-sectional view of the FIG. 1 integrated-circuit assembly after formation of a substantially planar insulative layer 16, including a portion 16a with voids and a portion 16b without voids.

FIG. 2 shows that the exemplary method next entails forming an insulative layer 16 over substrate 12 and wires 14a–14b. Layer 16 has a thickness 16t of, for example, 6000 angstroms, and includes two layers or sublayers 16a and 16b. Sublayer 16a includes a number of voids, particularly voids 17 between wires 14a and 14b, and between wires 14b and 14c, to increase its dielectric constant. Sublayer 16b is either substantially voidless or includes a substantially fewer number of voids than sublayer 16a. The presence of voids in sublayer 16a reduces lateral electrical coupling between adjacent metal features, for example, between wires 14a and 14b and between wires 14a–14c and any overlying conductive structures.

The exemplary method forms layer 16 using a combination of a non-conformal and conformal oxide depositions. In particular, it uses a CVD TEOS (chemical vapor deposition tetraethyl-orthosilicate) or PECVD TEOS (plasma-enhanced CVD TEOS) oxide deposition process at a non-conformal deposition rate to form void-filled sublayer 16a voids and then lowers the TEOS deposition rate to, a conformal rate to form substantially voidless sublayer 16b.

Figure 3:
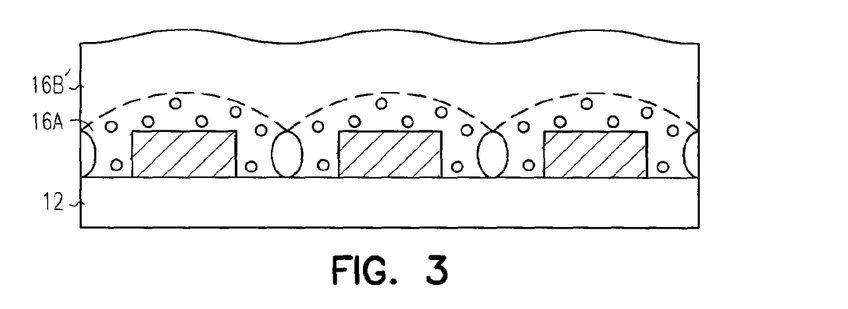
FIG. 3 is a cross-sectional view of the FIG. 2 assembly after a facet etch to improve the planarity of layer 16.

FIG. 3 shows that after forming sublayer 16b, which includes some level of nonplanarity, the exemplary method facet etches the sublayer at an angle of about 45 degrees to improve its global planarity. (That layer 16b has undergone further processing is highlighted by its new reference numeral 16b'.) The facet etch reduces or smooths any sharp trenches in regions overlying gaps between metal features, such as wires 14a–14c. As used herein, the term "facet etch" refers to any etch process that etches substantially faster in the horizontal direction than in the vertical direction. Thus, for example, the term includes an angled sputter etch or reactive-ion etch.

To optimize the slopes of any vias, one can perform the facet etch before via printing. More specifically, one can facet etch after etching any necessary vias and stripping photoresist to produce vias having greater slope and smoothness.

Figure 4:
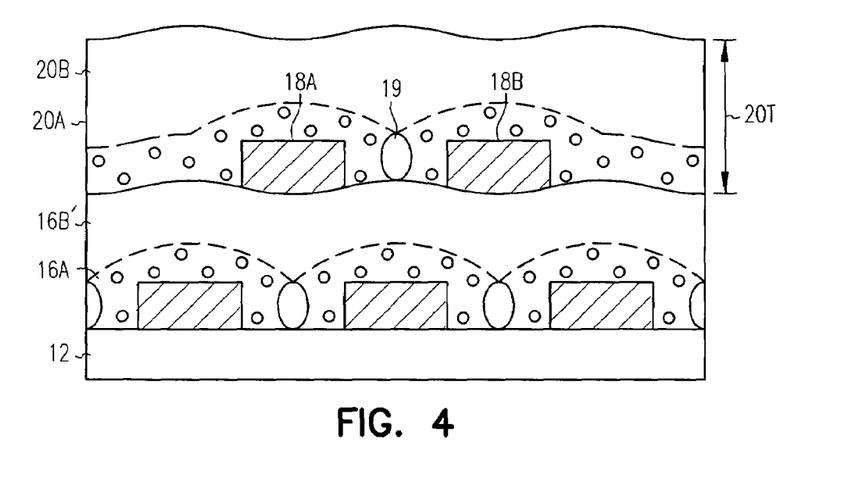
FIG. 4 is a cross-sectional view of the FIG. 3 assembly after formation of metal wires 18a and 18b, and substantially planar insulative layer 20, including a portion 20a with voids and a portion 20b without voids.

FIG. 4 shows the results of forming a second metallization level according to the procedure outlined in FIGS. 1–3. In brief, this entails forming conductive structures 18a and 18b on insulative sublayer 16b' and forming an insulative layer 20 on sublayer 16b' and conductive structures 18a and 18b. Insulative layer 20, like insulative layer 16, includes void-filled sublayer 20a and substantially void-free sublayer 20b'. Sublayer 20a includes one or more voids 19 between conductive structures 18a and 18b. Sublayer 20b' was facet etch to improve its planarity. Layer 20 has a thickness 20t, of for example 3000–6000 angstroms.

Second Exemplary Method of Forming Nearly Planar Dielectric Films

FIGS. 5–8 show a number of exemplary integrated-circuit assemblies, which taken collectively and sequentially, illustrate a second exemplary method of making nearly planar or quasi planar dielectric layers within the scope of the present invention. The second method is particularly applicable to maximum metal feature spacing greater than about 0.3 microns or oxide thickness less than 6000 angstroms to allow for shallow via formation, that is, via depths less than about 4000 angstroms.

Figure 5:
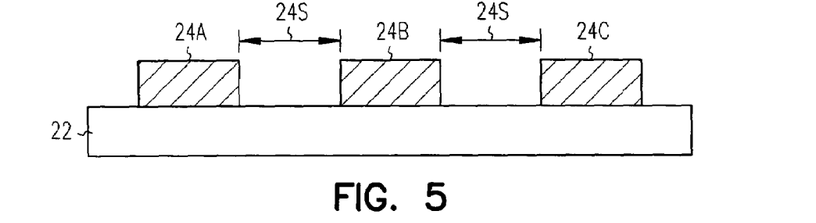
FIG. 5 is a cross-sectional view of a partial integrated-circuit assembly 21 including a substrate 22 and metal wires 24a, 24b, and 24c.

More particularly, FIG. 5 shows that the method begins with formation of an integrated-circuit assembly or structure 21, which, like assembly 10 in FIG. 1, can exist within any integrated circuit. Assembly 10 includes a substrate 22 which supports three representative wires or conductive structures 24a, 24b, and 24c, with a desired feature spacing 24s. In the exemplary embodiment, spacing 24s is greater than 0.3 microns. Some embodiments set a minimum spacing of 0.17 microns. However, the present invention is not limited to any particular spacing.

Figure 6:
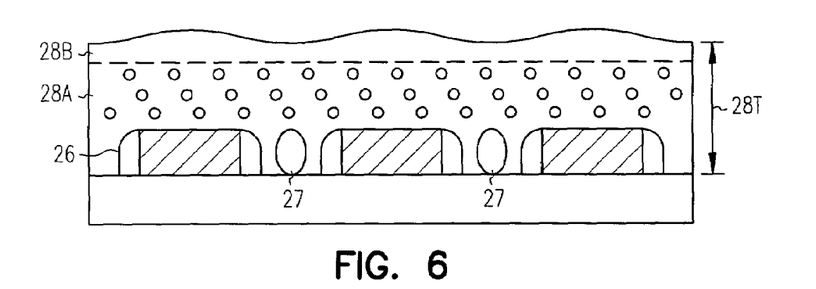
FIG. 6 is a cross-sectional view of the FIG. 5 assembly after formation of an oxide spacer 26 and a substantially planar insulative layer 28, including a portion 28a with voids and a portion 28b without voids.

FIG. 6 shows that the exemplary method next entails forming an insulative spacer 26 and an insulative layer 28. Insulative spacers 26, which consists of silicon dioxide for example, lies over portions of substrate 22 adjacent wires 24a–24c to reduce the effective separation of wires 24a–24c. The exemplary method uses a TEOS oxide deposition and subsequent etching to form spacers 26. Insulative layer 28 has a thickness 28t of, for example, 4000 angstroms, and includes two sublayers 28a and 28b, analogous to sublayers 16a and 16b in the first embodiment. Specifically, sublayer 28a includes a number of voids 27 between the wires to increase its dielectric constant, and sublayer 28b is either substantially voidless or includes a substantially fewer number of voids than sublayer 28a. A two-stage TEOS oxide deposition process, similar to that used in the first embodiment, is used to form layer 28.

Figure 7:
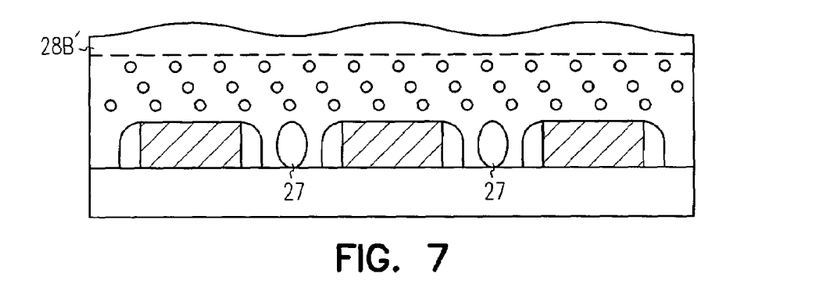
FIG. 7 is a cross-sectional view of the FIG. 6 assembly after a facet etch to improve the planarity of layer 28.

FIG. 7 shows that after forming sublayer 28b, which includes some level of nonplanarity, the exemplary method facet etches the sublayer at an angle of about 45 degrees to improve its global planarity.

Figure 8:
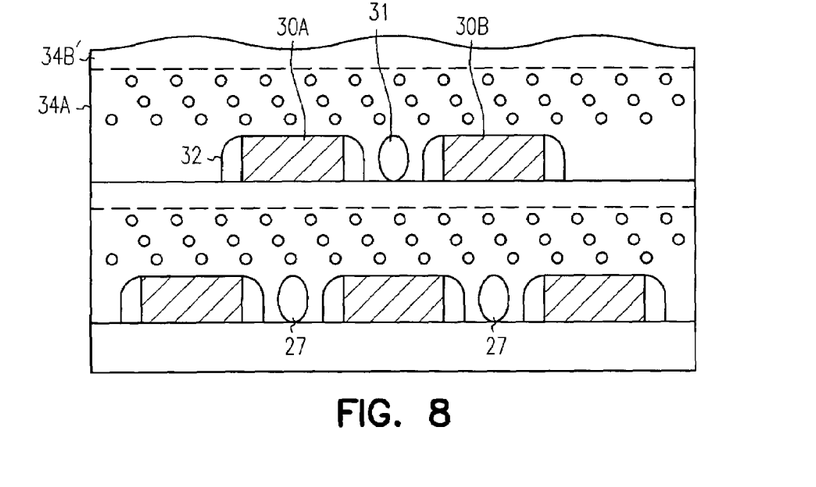
FIG. 8 is a cross-sectional view of the FIG. 7 assembly after formation of metal wires 30a and 30b, and substantially planar insulative layer 34, including a portion 34a with voids and a portion 34b without voids.

FIG. 8 shows the results of forming a second metallization level according to the procedure outlined in FIGS. 5–7. This entails forming conductive structures 30a and 30b on insulative sublayer 28b' and forming an insulative spacer 32 and an insulative layer 34, which, like insulative layer 28, includes void-filled sublayer 34a and substantially void-free sublayer 34b'. Sublayer 34a includes voids 31 between conductive structures 30a and 30b, and sublayer 34b' is facet etched to improve its planarity.

Third Exemplary Method of Forming Nearly Planar Dielectric Films

Figure 9:
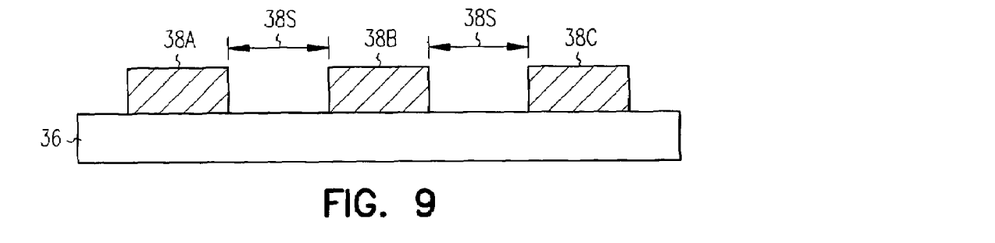
FIG. 9 is a cross-sectional view of a partial integrated-circuit assembly 35 including a substrate 36 and metal wires 36a, 36b, and 36c.
Figure 10:
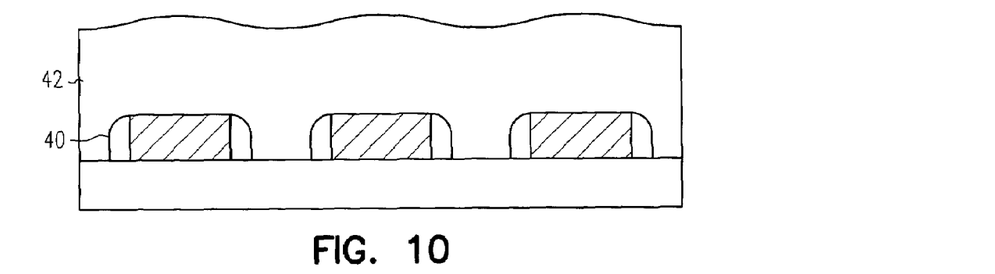
FIG. 10 is a cross-sectional view of the FIG. 9 assembly after formation of an oxide spacer 40 and a substantially planar insulative layer 42.

FIGS. 9 and 10 show a number of exemplary integrated-circuit assemblies, which taken collectively and sequentially, illustrate a third exemplary method of making nearly planar or quasi planar dielectric layers within the scope of the present invention. In contrast to the first and second embodiment, the third exemplary embodiment is intended for forming insulative films on metal layers with maximum feature spacing up to about 0.5 microns.

FIG. 9 shows that the method begins with formation of an integrated-circuit assembly or structure 35, which like assembly 10 in FIG. 1 and assembly 21 in FIG. 5, can exist within any integrated circuit. Assembly 35 includes a substrate 36 which supports three representative wires or conductive structures 38a, 38b, and 38c, with a desired feature spacing 38s of about 0.5 microns.

FIG. 10 shows the results of forming an oxide spacers 40 and an insulative layer 42. The exemplary embodiment forms one or more oxide spacers 40 which is about 1000 angstroms wide, and thus reduces the effective spacing between conductors 38a–38c by 2000 angstroms. Forming insulative layer 42 entails executing a flow-fill procedure, such as TRIKON-200 by Trikon Technologies, Inc. To obtain global and local planarity, one can reduce the maximum feature space by using oxide/TEOS spacer as taught in the second exemplary method, or by enlarging the metal feature, or by adding floating metal between the metal features.

Exemplary Method of Promoting Uniform Thickness of Intermetal Dielectric Layers

To facilitate the formation of more uniformly thick intermetal dielectric layers, such as those described above, the inventor developed specific methods of (and related computer software) for increasing the pattern density of metal layouts. The methods and associated software take a given metal layout and modify, or fill, open areas of the layout to increase pattern density and thus promote uniform thickness or reduce thickness variation across dielectric layers formed on metal layers based on the layouts. These methods and software can thus be used, for example, to facilitate formation of the conductive structures shown in FIGS. 1, 5, and 9.

Figure 11:
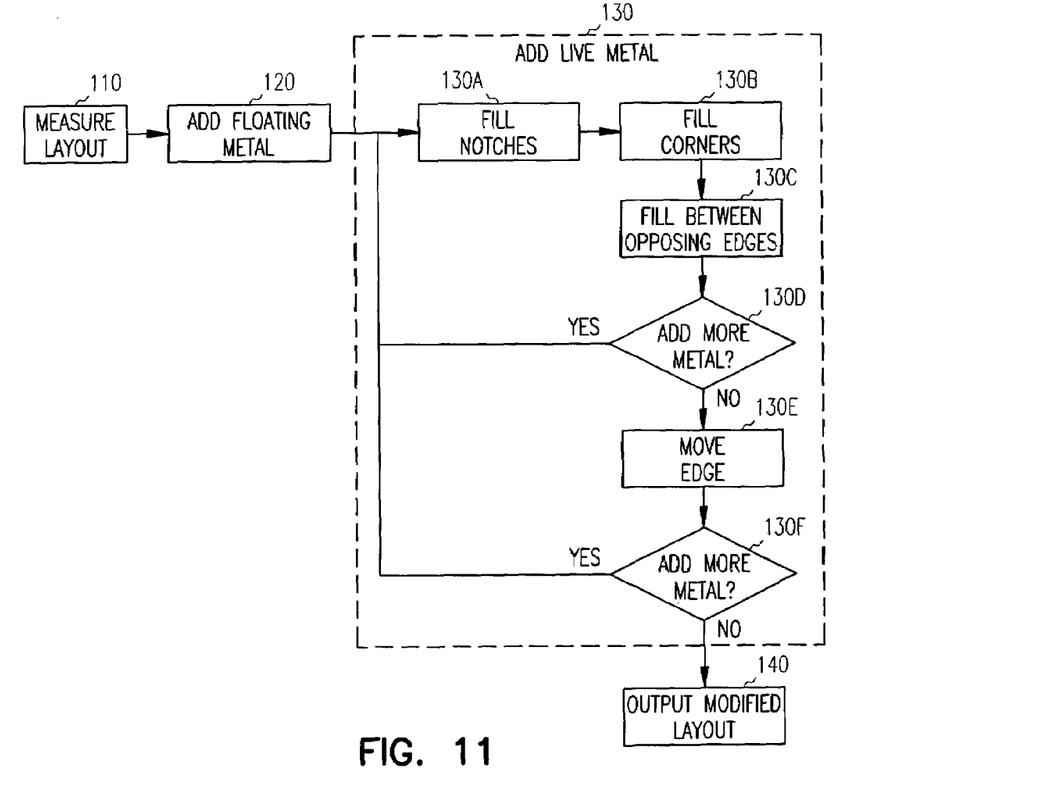
FIG. 11 is a flow chart illustrating an exemplary method of modifying a metal layout to facilitate fabrication of intermetal dielectric layers with more uniform thickness.

The exemplary method generally entails iteratively measuring a given layout, adding floating metal to fill large open areas in the layout, and extending or filling out existing metal areas to meet maximum feature spacing, or gap, criteria. FIG. 11 shows a flow chart of the exemplary method, which is suitable for implementation as a computer-executable program.

Specifically, the flow chart includes a number of process or decision blocks 110, 120, 130, and 140. The exemplary method begins at process block 110 which entails measuring a given layout. This entails determining open (unmetallized or nonconductive) areas large enough to be filled with floating metal and identifying live metal areas that require additional metal to obtain desired spacing. Floating metal is metal that is not coupled to a signal path or component, whereas live metal is metal that is coupled to a signal path or component.

Figure 12:
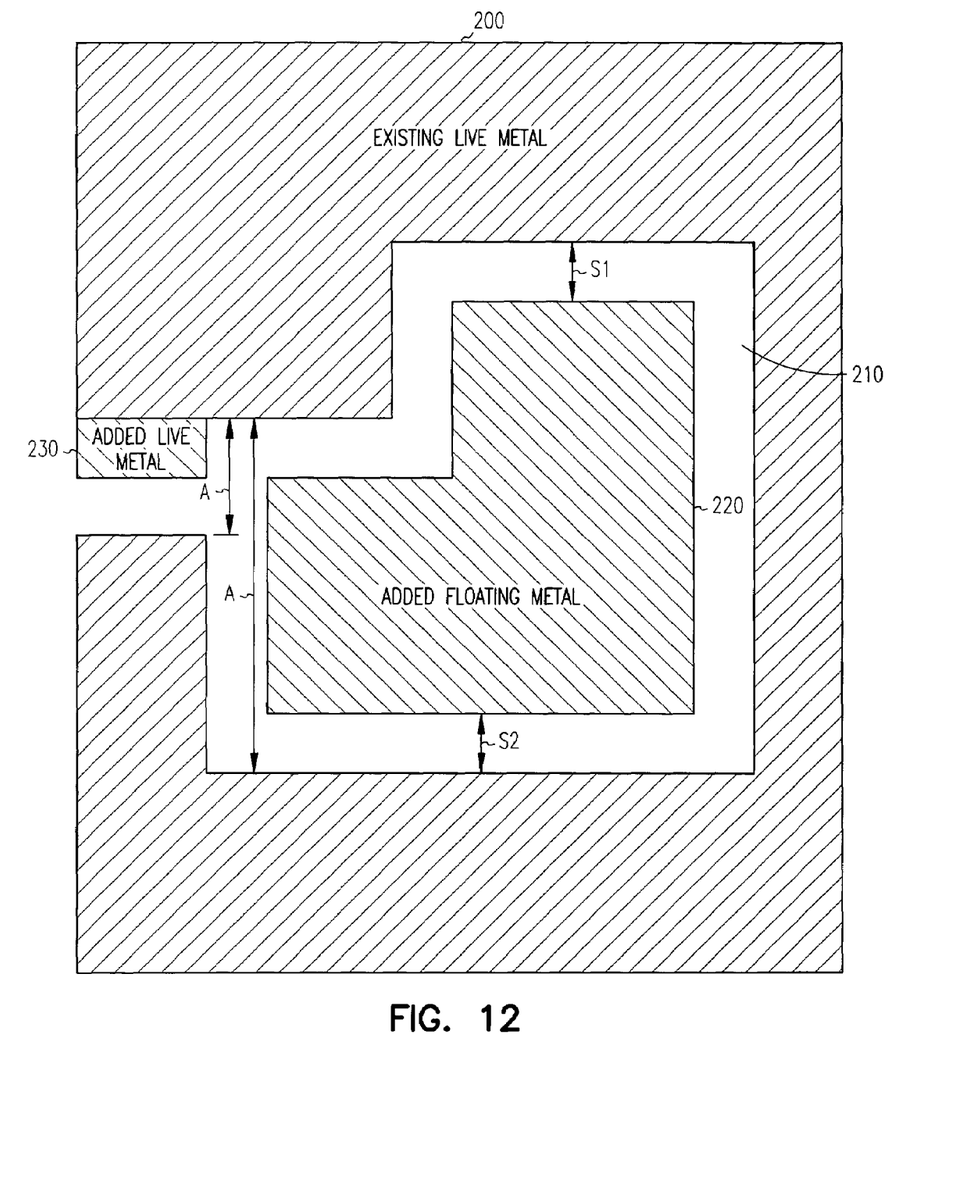
FIG. 12 is a partial top view of a metal layout showing how the exemplary method of FIG. 11 adds metal to open areas in a metal layout.

After executing block 110, the exemplary method proceeds to block 120 which entails adding floating metal to any large areas identified in block 110. To illustrate, FIG. 12 shows a hypothetical layout having a live metal region 200 with open area 210. In general, if dimension A is greater than the sum of dimension S1, dimension S2, and L (the maximum feature spacing criteria), the exemplary method adds floating metal, such as floating metal region 220.

After adding floating metal, the exemplary method adds live metal as indicated in block 120 of FIG. 11. FIG. 12 is again instructive of the exemplary method. If dimension B is less than the sum of dimension S1, dimension S2, and L, the exemplary method adds metal as indicated by added active metal region 230, process block 104 which entails filling in notches in the layout.

More particularly, the exemplary method follows an iterative process for adding live (or non-floating) metal, as indicated by blocks 130a–130g.

Figure 13:
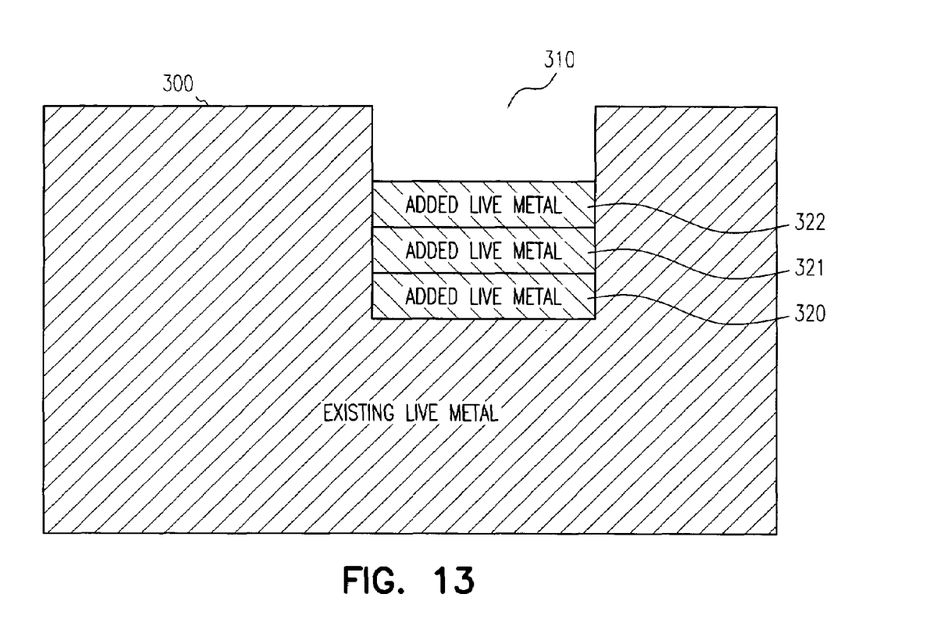
FIG. 13 is a partial top view of a metal layout showing how the exemplary method of FIG. 11 fills notches in a metal layout.

Block 130a entails filling notches in the current live metal. FIG. 13 shows a live metal region 300 of a hypothetical metal layout having a notch 310. Included within notch 310 are a series of iteratively added live metal regions 320–325. The amount of metal added at each iteration can be selected using a minimum surface area criteria or computed dynamically each iteration. The exemplary embodiment repeatedly adds metal to the notch until it is filled, before advancing to block 310b. However, other embodiments can advance to block 310b before the notch is filled, relying on subsequent trips or iterations through the first loop in the flowchart to complete filling of the notch.

Figure 14:
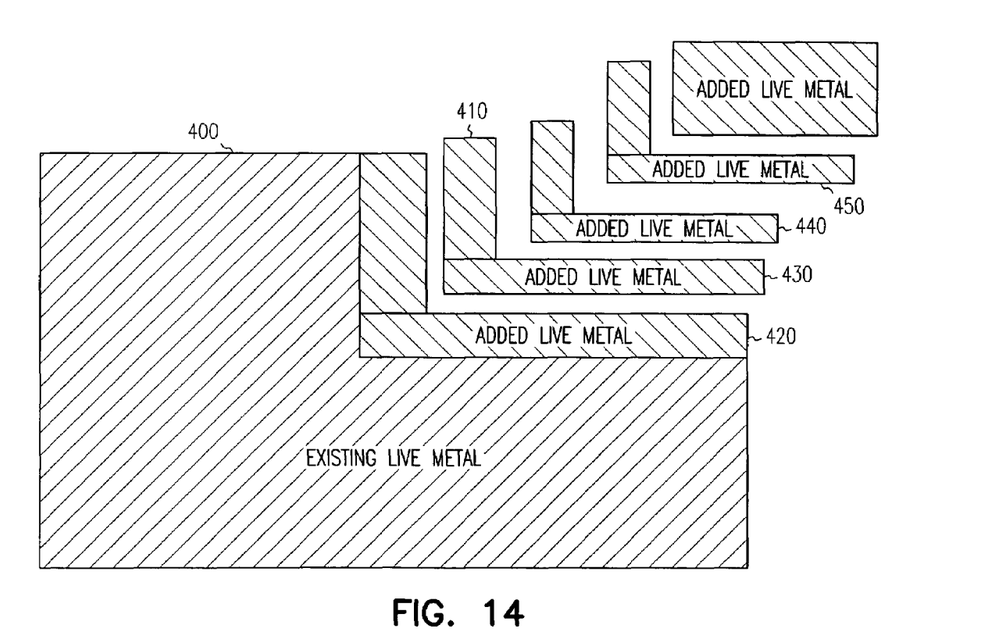
FIG. 14 is a partial top view of a metal layout showing how the exemplary method of FIG. 11 fills corners in a metal layout.

Block 130b entails filling in corners in the current live metal, meaning the live metal after filling notches. FIG. 14 illustrates a live metal region 400 having a corner 410 and added L-shaped live metal regions 420–423 and a rectangular live metal region 424. (Other embodiments add other shapes of live metal regions.) The amount of metal added at each iteration can be selected using a minimum surface area or single-dimensional criteria or computed dynamically each iteration. The exemplary embodiment repeatedly adds metal to the corner until it is filled, before advancing to block 130c. However, other embodiments can advance to block 310b before the notch is filled, relying on subsequent trips through the inner loop to complete filling of the notch.

Figure 15:
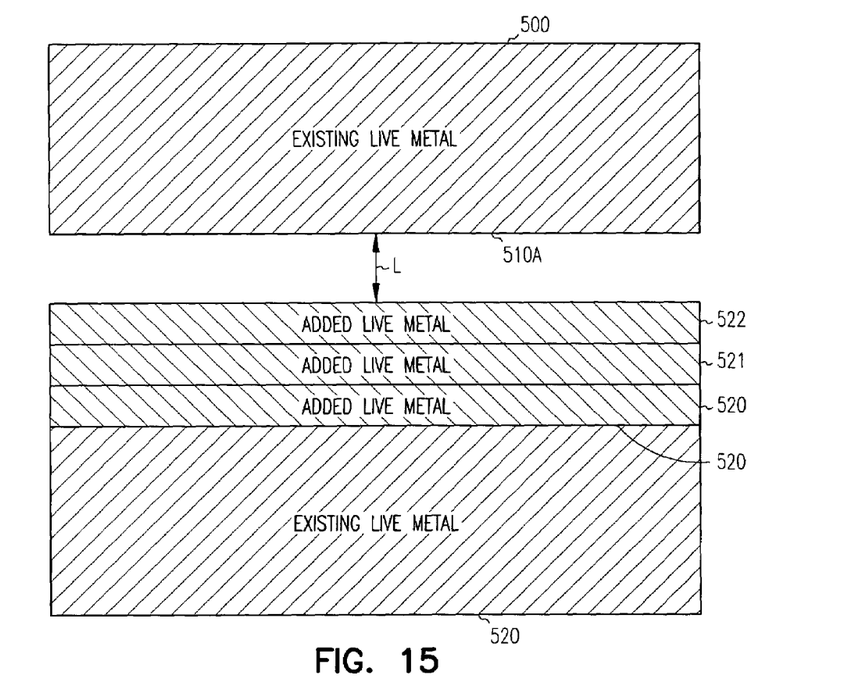
FIG. 15 is a partial view of a metal layout showing how the exemplary method of FIG. 11 fills in between opposing edges of live metal regions in a metal layout.

Block 130c entails filling in between opposing edges of adjacent live metal regions to achieve a desired spacing, such as a maximum desired spacing L. FIG. 15 shows live metal regions 510 and 520, which have respective opposing edges 510a and 520a. The exemplary method entails adding live metal regions, such as live metal regions 521–523, one edge such as edge 520a to achieved the maximum desired spacing L. However, other embodiments add live metal to both of the opposing edges to achieve the desired spacing. Still other embodiments look at the lengths of the opposing edges and use one or both of the lengths to determine one or more dimensions of the added live metal regions.

After filling in between opposing edges of existing live metal regions, the exemplary method advances to decision block 130d in FIG. 11. This block entails determining whether more live metal can be added. More precisely, this entails measuring the layout as modified by the live metal already added and determining whether there are any adjacent regions that violate the desired maximum spacing criteria. (Note that some exemplary embodiments include more than one maximum spacing criteria to account for areas where capacitive effects or crosstalk issues are of greater importance than others.) If the determination indicates that more metal can be added execution proceeds back to block 130a to fill in remaining notches, and so forth. If the determination indicates that no more live metal can be added to satisfy the maximum spacing criteria, execution to proceeds to block 130e in FIG. 11.

Figure 16:
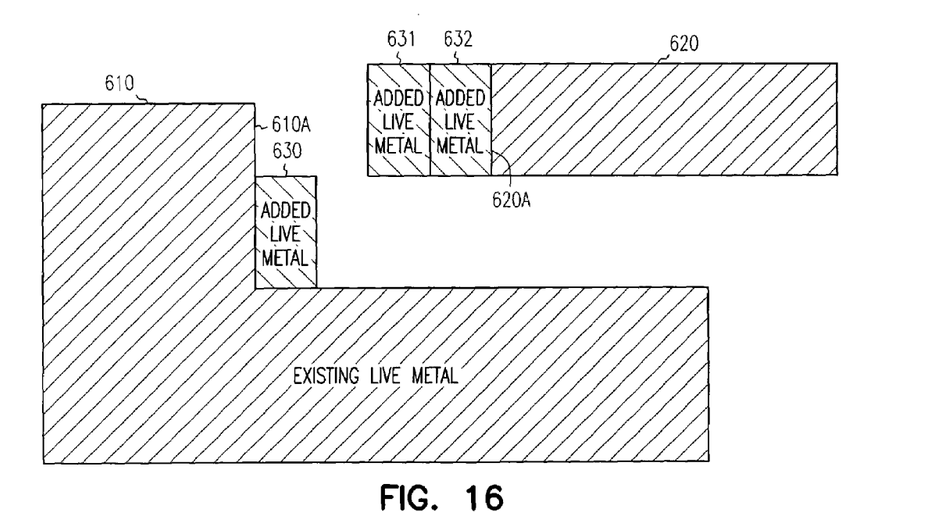
FIG. 16 is a partial view of a metal layout showing how the exemplary method of FIG. 11 moves edges.

Block 130e entails moving (or redefining) one or more edges (or portions of edges) of live metal regions in the modified layout specification. To illustrate, FIG. 16 shows live metal regions 610 and 620, which have respective edges 610a and 620a. It also shows the addition of live metal region 630 to edge 620a, which effectively extends the edge. Similarly, edge 620a has been extended with the iterative addition of live metal regions 631 and 632. The additions can be made iteratively using a dynamic or static step size, or all it once by computing the size of an optimal addition to each edge. Exemplary execution then proceeds to decision block 130f.

In decision block 130f, the exemplary method decides again whether more metal can be added to the layout. If more metal can be added, the exemplary method repeats execution of process blocks 104–122. However, if no metal can be added, the method proceeds to process block 140 to output the modified layout for use in a fabrication process.

Although not show explicitly in the exemplary flow chart in FIG. 11, the exemplary method performs data compaction to minimize or reduce the amount of layout data carried forward from iteration to iteration. Data compaction reduces the number of cells which define the circuit associated with the metal layout and the computing power necessary to create the metal layout.

The exemplary compaction scheme flattens all array placement into single instance placements. For example, a single array placement of a cell incorporating a 3×4 matrix flattens to 12 instances of a single cell. It also flattens specific cells, such as array core cells, vias, or contacts, based on layout or user settings. Additionally, it flattens cells which contain less than a predetermined number of shapes regardless of any other effects. For example, one can flatten cells having less than 10, 20, or 40 shapes. Lastly, the exemplary compaction scheme attempts to merge shapes to minimize overlapping shapes and redundant data.

The appropriate or optimum degree of flattening depends largely on the processing power and memory capabilities of the computer executing the exemplary method. Faster computers with more core memory and swap space can handle larger number of shapes per cell and thus have less need for flattening than slower computers with less core memory and swap space. In the extreme, a complete circuit layout can be flattened into one cell.

If a given layout design is not a single flat list of shapes but includes two or more cells placed into each other as instances, additional precaution should be taken to reduce the risk of introducing unintended shorts into the layout during the pattern-fill process. In the exemplary embodiment, this entails managing the hierarchy of cells.

The exemplary embodiment implements a hierarchy management process which recognizes that each cell has an associated fill area that will not change throughout the metal-fill process. The exemplary management process entails executing the following steps from the bottom up until all cell dependencies are resolved. For each instance in each cell, the process creates a temporary unique copy of the cell associated with a given instance. After this, the process copies metal from other cells into the cell being examined if it falls into the fill area. The process then copies metal from other cell into the cell if the metal falls into a ring around the fill area. Next, the process identifies, extracts, and marks conflict areas.

This exemplary pattern-filling method and other simpler or more complex methods embodying one or more filling techniques of the exemplary embodiment can be used in combination with the methods of making nearly planar intermetal dielectric layers described using FIGS. 1–10. More precisely, one can use a pattern-filling method according to the invention to define a layout for a particular metal layer, form a metal layer based on the layout, and then form a nearly planar intermetal dielectric layer according to the invention on the metal layer. The combination of these methods promises to yield not only a nearly planar dielectric layer that reduces or avoids the need for chemical-mechanical planarization, but also a dielectric layer with less thickness deviation because of the adjusted pattern fill density of the underlying metal layer.

Exemplary Computer System Incorporating Pattern-Filling Method

Figure 17:
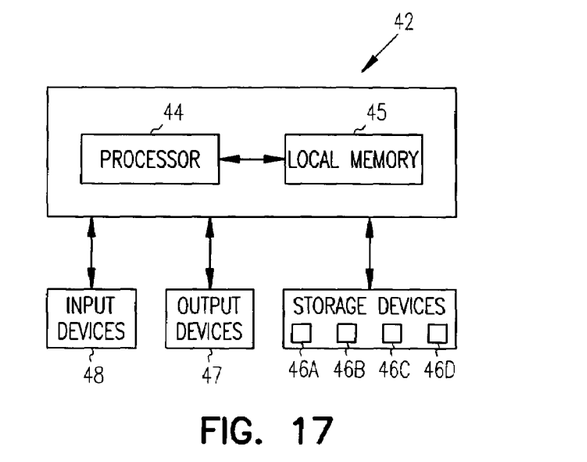
FIG. 17 is a block diagram of an exemplary computer system 42 for hosting and executing a software implementation of the exemplary pattern-filling method of FIG. 11.

FIG. 17 shows an exemplary computer system or workstation 42 for hosting and executing a software implementation of the exemplary pattern-filling method. The most pertinent features of system 42 include a processor 44, a local memory 45 and a data-storage device 46. Additionally, system 42 includes display devices 47 and user-interface devices 48. Some embodiments use distributed processors or parallel processors, and other embodiments use one or more of the following data-storage devices: a read-only memory (ROM), a random-access-memory (RAM), an electrically-erasable and programmable-read-only memory (EEPROM), an optical disk, or a floppy disk. Exemplary display devices include a color monitor, and exemplary user-interface devices include a keyboard, mouse, joystick, or microphone. Thus, the invention is not limited to any genus or species of computerized platforms.

Data-storage device 46 includes layout-development software 46a, pattern-filling software 46b, an exemplary input metal layout 46c, and an exemplary output metal layout 46d. (Software 46a and 46b can be installed on system 42 separately or in combination through a network-download or through a computer-readable medium, such as an optical or magnetic disc, or through other software transfer methods.) Exemplary storage devices include hard disk drives, optical disk drives, or floppy disk drives. In the exemplary embodiment, software 46b is an add-on tool to layout-development software 46a and layout 46c was developed using software 46a. However, in other embodiments, software 46b operates as a separate application program and layout 46c was developed by non-resident layout-development software. General examples of suitable layout-development software are available from Cadence and Mentor Graphics. Thus, the invention is not limited to any particular genus or species of layout-development software.

Exemplary Integrated Memory Circuit

Figure 18:
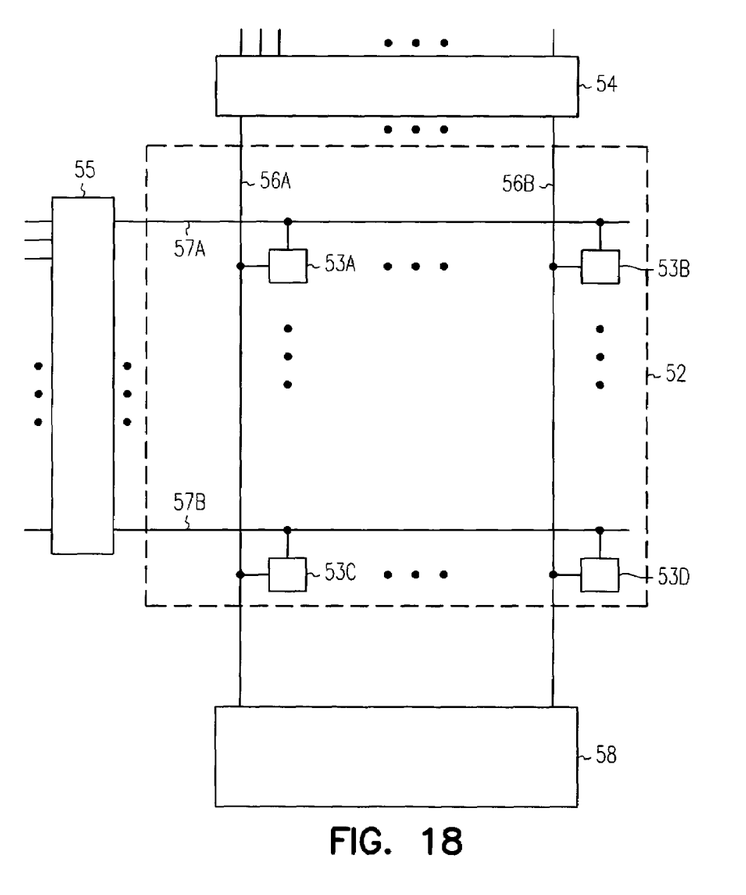
FIG. 18 is a simplified schematic diagram of an exemplary integrated memory circuit 50 that incorporates one or more nearly planar intermetal dielectric layers and/or metal layers made in accord with exemplary methods of the invention.

FIG. 18 shows an exemplary integrated memory circuit 50 that incorporates one or more nearly planar intermetal dielectric layers and/or metal layers within the scope of the present invention. One more memory circuits resembling circuit 50 can be used in a variety of computer or computerized systems, such as system 42 of FIG. 17.

Memory circuit 50, which operates according to well-known and understood principles, is generally coupled to a processor (not shown) to form a computer system. More particularly, circuit 50 includes a memory array 52, which comprises a number of memory cells 53a, 53b, 53c, and 53d; a column address decoder 54, and a row address decoder 55; bit lines 56a and 56b; word lines 57a and 57b; and voltage-sense-amplifier circuit 58 coupled in conventional fashion to bit lines 56a and 56b. (For clarity, FIG. 18 omits many conventional elements of a memory circuit.)

CONCLUSION

In furtherance of the art, the inventor has presented several methods for making nearly planar intermetal dielectric layers without the use of chemical-mechanical planarization. Additionally, the inventor has presented a method of modifying metal layouts to facilitate formation of dielectric films with more uniform thickness. These methods of modifying metal layouts and making dielectric layers can be used in sequence to yield nearly planar intermetal dielectric layers with more uniform thickness.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

The invention claimed is:

1. A method of forming a nearly planar dielectric film on a metal layer, comprising:
   forming a metal layer having a predetermined maximum feature spacing;
   forming an oxide layer on the metal layer using a two-layers TEOs-based procedure with a first layer having a deposition rate higher than a deposition rate of the second layer;
   facet-etching the oxide layer; and
   reflowing at least a portion of the oxide layer.

2. The method of claim 1, wherein forming the metal layer comprises forming metal layer with a maximum feature spacing of 0.3 microns.

3. The method of claim 1, wherein forming the metal layer comprises forming metal runners and wherein forming the oxide layer forms oxide on one or more sidewalls of the metal runners.

4. The method of claim 1, wherein forming the metal layer comprises:
   identifying and filling in open areas of a metal layout with floating metal;
   identifying and filling in notches of the metal layout; and
   identifying and filling in centers of the metal layout.

5. A method of forming a nearly planar dielectric film on a metal layer, comprising:
   forming a metal layer having a predetermined maximum feature spacing;
   forming an oxide layer on the metal layer using a TEOS-based procedure;
   facet-etching the oxide layer; and
   reflowing at least a portion of the oxide layer,
   wherein forming the oxide layer comprises forming a portion of the oxide layer using a TEOS-based procedure at a first deposition rate and forming a portion of the oxide layer using a TEOS-based procedure at a second deposition rate which is less than the first deposition raze.

6. A method of forming a nearly planar dielectric film on a metal layer, comprising:
   forming a metal layer having a predetermined maximum feature spacing;
   forming an, oxide layer on the metal layer using a TEOS-base procedure;
   facet-etching the oxide layer; and
   reflowing at least a portion of the oxide layer,
   wherein forming the oxide layer comprises forming a portion of the oxide layer using a TEOS-based procedure at a first deposition rate having a tendency to form voids and forming a portion of the oxide layer using a TEOS-based procedure at a second deposition rate having a tendency to form substantially no voids or fewer voids than the first deposition rate.

7. A method comprising:
forming a metal layer having a predetermined maximum feature spacing of 0.3 microns;
forming a first oxide layer using a TEOS-based procedure at a first deposition rate on the metal layer;
forming a second oxide layer on the first oxide layer using a TEOS-based procedure at a second deposition rate which is less than the first deposition rate; and
facet etching the second oxide layer.

8. The method of claim 7, wherein the TEOS-based procedure at the first deposition rate has a tendency to form voids and the TEOS-based procedure at the second deposition rate has a tendency to form substantially no voids or fewer voids than the first deposition rate.

9. The method of claim 7, further including:
reflowing at least a portion of the oxide layer; and
depositing a film resistant to lateral etching.

10. The method of claim 7, wherein forming the metal layer comprises
forming a first metal layer;
depositing a film resistant to lateral etching on the first metal layer; and
etching the first metal layer to form a metal pattern having a predetermined maximum feature spacing of 0.3 microns to form the metal layer.

11. The method of claim 7, wherein forming the metal layer comprises:
identifying and filling in open area of a metal layout with floating metal;
identifying and filling in notches of the metal layout; and
identifying and filling in comers of the metal layout.

12. A method comprising:
forming a metal layer;
depositing a film resistant to lateral etching on the metal layer;
etching the metal layer to form a metal pattern having a predetermined maximum feature spacing of 0.3 microns;
forming a first oxide layer using a TEOS-based procedure at a first deposition rate on the metal pattern;
forming a second oxide layer on the first oxide layer using a TEOS-based procedure at a second deposition rate which is less than the first deposition rate; and
facet etching the second oxide layer.

13. The method of claim 12, wherein the TEOS-based procedure at the first deposition rate has a tendency to form voids and the TEOS-based procedure at the second deposition rate has a tendency to form substantially no voids or fewer voids than the first deposition rate.

14. The method of claim 12, wherein forming the metal layer comprises:
providing a firs metal layout having a first pattern fill density;
generating a metal layout pattern based on the first metal layer and having a second pattern fill density greater than the first pattern fill density;
forming a metal pattern on a layer;
deposition a dielectric material on the metal pattern at a first deposition rate; and
depositing a dielectric material on the deposited dielectric material at a second deposition rate less than the first deposition rate.

* * * * *

UNITED STATES PATENT AND TRADEMARK OFFICE
CERTIFICATE OF CORRECTION

PATENT NO. : 7,125,800 B2
APPLICATION NO. : 10/677057
DATED : October 24, 2006
INVENTOR(S) : Juengling It is certified that error appears in the above-identified patent and that said Letters Patent is hereby corrected as shown below:

Title Page

On page 2, in field (56), under "U.S. Patent Documents", in column 2, line 2, after "6,531,412" delete "B1 *" and insert -- B2 * --, therefor.

In column 4, line 33, delete "increase" and insert -- decrease --, therefor.

In column 10, line 20, in Claim 1, delete "TEOs-based" and insert -- TEOS-based--, therefor.

In column 10, line 38, in Claim 4, delete "centers" and insert -- corners --, therefor.

In column 10, line 52, in Claim 5, delete "raze" and insert -- rate --, therefor.

In column 10, line 57, in Claim 6, after "an" delete ",".

In column 11, line 19, in Claim 10, after "comprises" insert -- : --.

In column 11, line 28, in Claim 11, delete "area" and insert -- areas --, therefor.

In column 11, line 32, in Claim 11, delete "comers" and insert -- corners --, therefor.

In column 12, line 21, in Claim 14, delete "firs" and insert -- first --, therefor.

In column 12, line 24, in Claim 14, delete "layer" and insert -- layout --, therfor.

UNITED STATES PATENT AND TRADEMARK OFFICE
CERTIFICATE OF CORRECTION

PATENT NO.       : 7,125,800 B2
APPLICATION NO.  : 10/677057
DATED            : October 24, 2006
INVENTOR(S)      : Juengling It is certified that error appears in the above-identified patent and that said Letters Patent is hereby corrected as shown below:

In column 12, line 27, in Claim 14, delete "deposition" and insert -- depositing --, therefor.

Signed and Sealed this

Twentieth Day of March, 2007

JON W. DUDAS
*Director of the United States Patent and Trademark Office*